(12) United States Patent
Buchwalter et al.

(10) Patent No.: US 8,242,010 B2
(45) Date of Patent: *Aug. 14, 2012

(54) ELECTRICAL INTERCONNECT FORMING METHOD

(75) Inventors: Stephen Leslie Buchwalter, Hopewell Junction, NY (US); Bruce K. Furman, Poughquag, NY (US); Peter A. Gruber, Mohegan Lake, NY (US); Jae-Woong Nah, Yorktown Heights, NY (US); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 128 days.

This patent is subject to a terminal disclaimer.

(21) Appl. No.: 12/787,503

(22) Filed: May 26, 2010

(65) Prior Publication Data

US 2010/0230474 A1 Sep. 16, 2010

Related U.S. Application Data

(62) Division of application No. 11/733,840, filed on Apr. 11, 2007, now Pat. No. 7,786,001.

(51) Int. Cl.
*H01L 21/44* (2006.01)

(52) U.S. Cl. ........ 438/613; 438/616; 438/109; 438/615; 438/612; 438/118; 257/780; 257/781; 257/777; 257/E21.476; 174/255

(58) Field of Classification Search .................. 438/613, 438/616, 109, 615, 118, 612; 257/780, 781, 257/777, E21.476; 174/255

See application file for complete search history.

(56) References Cited

U.S. PATENT DOCUMENTS

| | | | |
|---|---|---|---|
| 5,244,143 A | 9/1993 | Ference et al. | |
| 5,736,074 A | 4/1998 | Hayes et al. | |
| 5,775,569 A | 7/1998 | Berger et al. | |
| 6,105,852 A | 8/2000 | Cordes et al. | |
| 6,332,569 B1 | 12/2001 | Cordes et al. | |
| 6,335,571 B1 | 1/2002 | Capote et al. | |
| 6,344,690 B1 | 2/2002 | Kitajima et al. | |
| 6,458,622 B1 | 10/2002 | Keser et al. | |
| 7,087,458 B2 | 8/2006 | Wang et al. | |
| 7,786,001 B2 * | 8/2010 | Buchwalter et al. | 438/613 |
| 7,868,457 B2 | 1/2011 | Furman et al. | |
| 2002/0171157 A1 | 11/2002 | Soga et al. | |
| 2004/0110010 A1 | 6/2004 | Buchwalter et al. | |
| 2004/0126927 A1 * | 7/2004 | Lin et al. | 438/107 |
| 2005/0035453 A1 | 2/2005 | Ho et al. | |

OTHER PUBLICATIONS

U.S. Appl. No. 12/787,485, filed May 26, 2010; Confirmation No. 4695.
U.S. Appl. No. 12/787,524, filed May 26, 2010; Confirmation No. 4776.
Notice of Allowance (Mail Date Apr. 20, 2010) for U.S. Appl. No. 11/733,840, filed Apr. 11, 2007; Confirmation No. 8894.

(Continued)

*Primary Examiner* — Junghwa M Im
(74) *Attorney, Agent, or Firm* — Schmeiser, Olsen & Watts; Daniel P. Morris

(57) ABSTRACT

An electrical interconnect forming method. The electrical interconnect includes a first substrate comprising a first electrically conductive pad, a second substrate comprising a second electrically conductive pad, and an interconnect structure electrically and mechanically connecting the first electrically conductive pad to the second electrically conductive pad. The interconnect structure comprises a non-solder metallic core structure, a first solder structure, and a second solder structure. The first solder structure electrically and mechanically connects a first portion of the non-solder metallic core structure to the first electrically conductive pad. The second solder structure electrically and mechanically connects a second portion of the non-solder metallic core structure to the second electrically conductive pad.

20 Claims, 9 Drawing Sheets

OTHER PUBLICATIONS

Jang et al.; Interfacial morphology and shear deformation of flip chip solder joints; J. Mater. Res., vol. 15, No. 8, Aug. 2000; pp. 1679-1687.

D. R. Frear; Materials Issues in Area-Array Microelectronic Packaging; JOM; Mar. 1999; 51, 3; ABI/INFORM Trade & Industry; pp. 22-27.

K. N. Tu; Recent advances on electromigration in very-large-scale-integration of interconnects; Journal of Applied Physics, vol. 94, No. 9; Nov. 1, 2003; pp. 5451-5473.

Gruber et al.; Low-cost wafer bumping; IBM J. Res. & Dev., vol. 49, No. 4/5; Jul./Sep. 2005; pp. 621-639.

Feger et al.; A Wafer-level Underfill Process for Flip-chip Packaging; IMAPS 2002; Sep. 4-6, 2002, Denver, CO; 6 pages.

Office Action (Mail Date Mar. 26, 2012) for U.S. Appl. No. 12/787,485, filed May 26, 2010.

* cited by examiner

ELECTRICAL INTERCONNECT FORMING METHOD

This application is a divisional application claiming priority to Ser. No. 11/733,840, filed Apr. 11, 2007, now U.S. Pat. No. 7,786,001 issued Aug. 31, 2010.

FIELD OF THE INVENTION

The present invention relates to an electrical interconnect structure and associated method for forming an electrical interconnect structure.

BACKGROUND OF THE INVENTION

Connections between structures are typically unreliable and subject to failure. Accordingly, there exists a need in the art to overcome at least one of the deficiencies and limitations described herein above.

SUMMARY OF THE INVENTION

The present invention provides a method for forming an electrical structure comprising:

providing a first substrate comprising a first electrically conductive pad, a second substrate comprising a second electrically conductive pad, and a transfer film comprising a non-solder metallic core structure, wherein said non-solder metallic core structure comprises a cylindrical shape;

forming a first solder structure on said first electrically conductive pad;

first positioning after said forming said first solder structure, said transfer film such that a first side of said non-solder metallic core structure is in contact with said first solder structure;

first heating after said first positioning, said non-solder metallic core structure to a temperature sufficient to cause said first solder structure to melt and form an electrical and mechanical connection between said first side of said non-solder metallic core structure and said first electrically conductive pad;

removing after said first heating, said transfer film from said non-solder metallic core structure;

forming a second solder structure on said second electrically conductive pad;

second positioning, after said forming said second solder structure, said first substrate comprising said non-solder metallic core structure such that a second side of said non-solder metallic core structure is in contact said second solder structure; and second heating after said second positioning, said non-solder metallic core structure to a temperature sufficient to cause said second solder structure solder to melt and form an electrical and mechanical connection between said second side of said non-solder metallic core structure and said second electrically conductive pad resulting in an electrical and mechanical connection between said first electrically conductive pad and said second electrically conductive pad.

The present invention advantageously provides a simple structure and associated method for forming connections between structures.

DETAILED DESCRIPTION OF THE INVENTION

Figure 1:
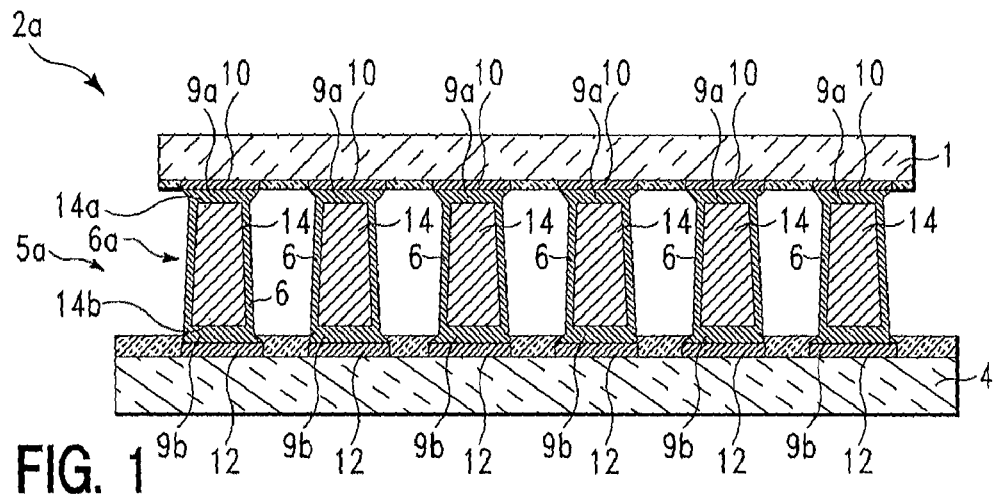
FIG. 1 illustrates a cross sectional view of a first electrical structure, in accordance with embodiments of the present invention

FIG. 1 illustrates a cross sectional view of an electrical structure 2a, in accordance with embodiments of the present invention. Electrical structure 2a comprises a substrate 1, a substrate 4, and a plurality of interconnect structures 5a. Substrate 1 comprises a plurality of electrically conductive pads 10. Each pad of electrically conductive pads 10 may be connected to wires or electrical components within substrate 1. Substrate 4 comprises a plurality of electrically conductive pads 12. Each pad of electrically conductive pads 12 may be connected to wires or electrical components within substrate 4. Substrate 1 may comprise, inter alia, a semiconductor device (e.g., an integrated circuit chip, a semiconductor wafer, etc), a chip carrier (organic or inorganic), a printed circuit board, etc. Substrate 4 may comprise, inter alia, a semiconductor device (e.g., an integrated circuit chip, a semiconductor wafer, etc), a chip carrier (organic or inorganic), a printed circuit board, etc. Each interconnect structure 5a comprises a non-solder metallic (i.e., does not comprise any solder material) core structure 14 and a solder structure 6a. Solder structure 6a comprises solder. Solder is defined herein as a metal alloy comprising a low melting point (i.e., about 100 degrees Celsius to about 340 degrees Celsius) that is used to join metallic surfaces together without melting the metallic surfaces. Solder structure 6a comprises a layer of solder that completely surrounds non-solder metallic core structure 14. Alternatively (i.e., instead of a layer of solder that completely surrounds non-solder metallic core structure 14), solder structure 6a could comprise a first portion of solder 9a attached to a top side 14a of non-solder metallic core structure 14 and a second portion of solder 9b attached to a bottom side 14b of non-solder metallic core structure 14. Each non-solder metallic core structure 14 may comprise any conductive metallic material that does not comprise solder including, inter alia, copper, gold, nickel, etc. Each interconnect structure 5a electrically and mechanically connects an electrically conductive pad 10 to an electrically conductive pad 12. Non-solder metallic core structure 14 comprises a cylindrical shape. Solder structure 6a may comprise any solder material suitable for flip chip interconnections including, inter alia, an alloy of tin such as SnCu, SnAgCu, SnPb, etc.

Figure 2:
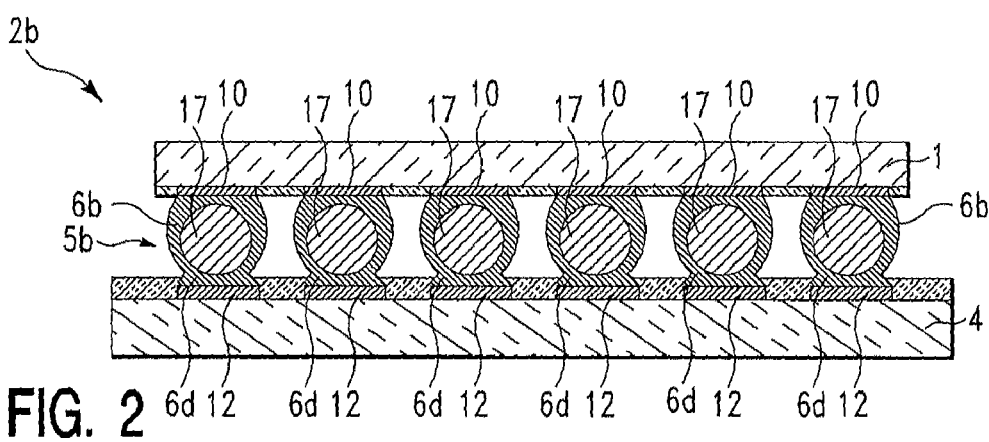
FIG. 2 depicts a first alternative to FIG. 1 illustrating a cross sectional view of a second electrical structure, in accordance with embodiments of the present invention.

FIG. 2 depicts a first alternative to FIG. 1 illustrating a cross-sectional view of an electrical structure 2b, in accordance with embodiments of the present invention. Electrical structure 2b comprises substrate 1, substrate 4, and a plurality of interconnect structures 5b. In contrast with electrical structure 2a of FIG. 1, electrical structure 2b of FIG. 2 comprises a plurality of interconnect structures 5b. Each of interconnect structures 5b comprises a spherical non-solder (i.e., does not comprise any solder material) metallic core structure 17 and a solder structure 6b. Each solder structure 6b comprises a layer of solder that completely surrounds an associated non-solder metallic core structure 17. Additionally, each of interconnect structures 5b may comprise an additional solder structure 6d. Each solder structure 6b electrically and mechanically connects the associated non-solder metallic core structure 17 to an associated electrically conductive pad 10. Each solder structure 6d electrically and mechanically connects the associated non-solder metallic core structure 17 (i.e., thru solder structure 6b) to an associated electrically conductive pad 12. The aforementioned connections result in each interconnect structure 5b electrically and mechanically connecting an electrically conductive pad 10 to an associated electrically conductive pad 12. Optionally, two different types of solder materials may be used for solder structure 6b and solder structure 6d. For example, solder structure 6b may comprise an AuSn solder material and solder structure 6d may comprise a solder material such as, inter alia, SnAg, SnCu, SnAgCu, SnBi, etc. For first level area array interconnects, each non-solder metallic core structure 17 may comprise a diameter of about 25 microns to about 150 microns. For second level area array interconnects (e.g., a ball grid array (BGA)), each non-solder metallic core structure 17 may comprise a diameter of about 0.2 mm to about 1.5 mm. Each non-solder metallic core structure 17 may comprise a core of any conductive metallic material that does not comprise solder including, inter alia, copper, gold, nickel, etc. Additionally, each non-solder metallic core structure 17 may comprise an additional layer(s) of non-solder metallic materials (i.e., different from a material comprised by non-solder metallic core structure 17) surrounding (e.g., see layer 19 in FIG. 3, infra) non-solder metallic core structure 17. The additional layer(s) may comprise any conductive metallic material including, inter alia, nickel, gold, tin, etc.

Figure 3:
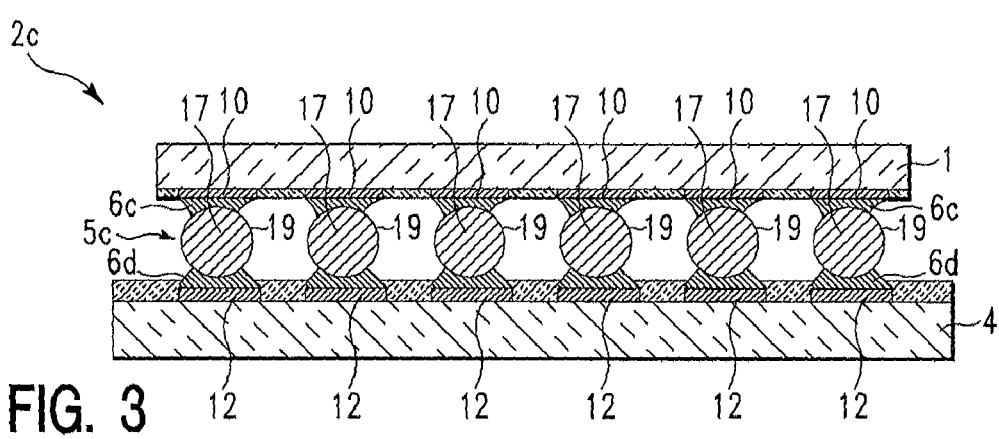
FIG. 3 depicts a first alternative to FIG. 2 illustrating a cross sectional view of a third electrical structure, in accordance with embodiments of the present invention.

FIG. 3 depicts a first alternative to FIG. 2 illustrating a cross sectional view of an electrical structure 2c, in accordance with embodiments of the present invention. Electrical structure 2c comprises substrate 1, substrate 4, and a plurality of interconnect structures 5c. In contrast with electrical structure 2b of FIG. 2, electrical structure 2c of FIG. 3 comprises a plurality of interconnect structures 5c. Each of interconnect structures 5c comprises a non-solder metallic core structure 17, a solder structure 6c, and a solder structure 6d. Each solder structure 6c electrically and mechanically connects an associated non-solder metallic core structure 17 to an associated electrically conductive pad 10. Each solder structure 6d electrically and mechanically connects an associated non-solder metallic core structure 17 to an associated electrically conductive pad 12. The aforementioned connections result in each interconnect structure 5c electrically and mechanically connecting an electrically conductive pad 10 to an associated electrically conductive pad 12. Optionally, two different types of solder materials may be used for solder structure 6c and solder structure 6d. For example, solder structure 6c may comprise an AuSn solder material and solder structure 6d may comprise a solder material such as, inter alia, SnAg, SnCu, SnAgCu, SnBi, etc. Each non-solder metallic core structure 17 may comprise a core of any conductive metallic material that does not comprise solder including, inter alia, copper, gold, nickel, etc. Additionally, each non-solder metallic core structure 17 may comprise an additional layer(s) 19 of non-solder metallic materials (i.e., different from a material comprised by non-solder metallic core structure 17) surrounding non-solder metallic core structure 17. Additional layer(s) 19 may comprise any conductive metallic material including, inter alia, nickel, gold, tin, etc.

Figure 4:
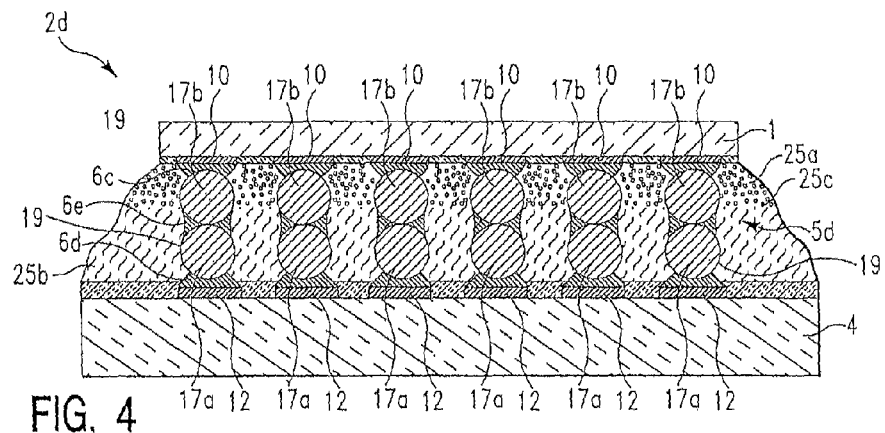
FIG. 4 depicts a first alternative to FIG. 3 illustrating a cross sectional view of a fourth electrical structure, in accordance with embodiments of the present invention.

FIG. 4 depicts a first alternative to FIG. 3 illustrating a cross sectional view of an electrical structure 2d, in accordance with embodiments of the present invention. Electrical structure 2d comprises substrate 1, substrate 4, and a plurality of interconnect structures 5d. In contrast with electrical structure 2c of FIG. 3, electrical structure 2d of FIG. 4 comprises a plurality of interconnect structures 5d. Each of interconnect structures 5d comprises a non-solder metallic core structure 17a, a non-solder metallic core structure 17b, a solder structure 6c, a solder structure 6d, a solder structure 6e. Additionally (i.e., optionally), electrical structure 2d comprises an underfill encapsulant layer 25a and an underfill encapsulant layer 25b. Each solder structure 6e electrically and mechanically connects a non-solder metallic core structure 17a to an associated a non-solder metallic core structure 17b. Each solder structure 6c electrically and mechanically connects a non-solder metallic core structure 17a to an associated electrically conductive pad 10. Each solder structure 6d electrically and mechanically connects a non-solder metallic core structure 17b to an associated electrically conductive pad 12. The aforementioned connections result in each interconnect structure 5d electrically and mechanically connecting an electrically conductive pad 10 to an associated electrically conductive pad 12. Optionally, three different types of solder materials may be used for solder structure 6c, solder structure 6d, and solder structure 6e. For example, solder structure 6c may comprise an AuSn solder material, solder structure 6d may comprise a solder material such as, inter alia, SnAg, SnCu, etc, and solder structure 6e may comprise a solder material such as, inter alia, SnAgCu, SnBi, etc. Each non-solder metallic core structure 17a and 17b may comprise a core of any conductive metallic material that does not comprise solder including, inter alia, copper, gold, nickel, etc. Non-solder metallic core structure 17a may comprise a first material (e.g., copper) and non-solder metallic core structure 17b may comprise a second material (e.g., gold). Additionally, each non-solder metallic core structure 17a and 17b may comprise an additional layer(s) 19 of metallic materials (i.e., different from a material comprised by non-solder metallic core structure 17a and 17b) surrounding non-solder metallic core structure 17a and 17b. Additional layer(s) 19 may comprise any conductive metallic material including, inter alia, nickel, gold, tin, etc. Additionally, non-solder metallic core structure 17a may comprise a layer(s) 19 comprising a different material from a layer(s) 19 on non-solder metallic core structure 17b. Underfill encapsulant layer 25a surrounds non-solder metallic core structures 17a and is in contact with substrate 1. Underfill encapsulant layer 25b surrounds non-solder metallic core structures 17b and is in contact with substrate 4. Underfill encapsulant layer 25a is in contact with underfill encapsulant layer 25b. Underfill encapsulant layer 25a may comprise a first material (e.g., a highly filled silica-epoxy composite adhesive) and underfill encapsulant layer 25b may comprise a second and different material (e.g., a lightly filled silica-epoxy composite adhesive). Underfill encapsulant layer 25a may comprise a first coefficient of thermal expansion (e.g., comprising a range of about 5-15 ppm/C) that is different (e.g., lower) from a second coefficient of thermal expansion (e.g., comprising a range of about 15.1-40 ppm/C) comprised by encapsulant layer 25b. Underfill encapsulent layer 25a may additionally comprise a filler 25c dispersed throughout.

Figure 5:
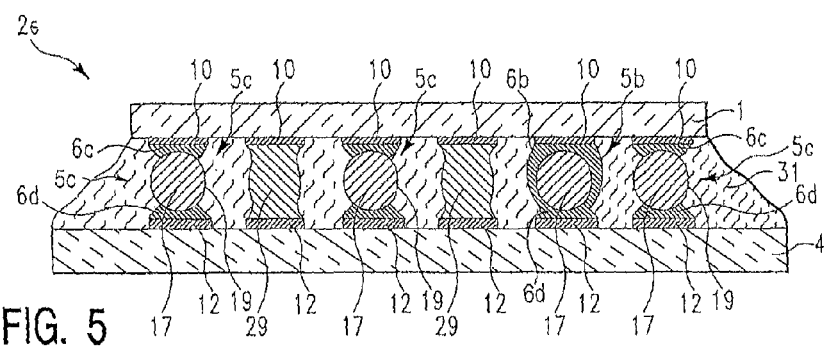
FIG. 5 illustrates a cross sectional view of a fifth electrical structure, in accordance with embodiments of the present invention.

FIG. 5 illustrates a cross sectional view of an electrical structure 2e, in accordance with embodiments of the present invention. Electrical structure 2e in FIG. 5 is a combination of electrical structures 2b and 2c, of FIGS. 2-3. In addition to electrical structures 2b and 2c, of FIGS. 2-3, electrical structure 2e in FIG. 5 comprises interconnection structures 29 (i.e., comprising solder) electrically and mechanically connecting some of electrically conductive pads 10 to associated electrically conductive pads 12. Therefore, electrical structure 2e uses a combination of interconnect structures 5b, 5c, and 29 to electrically and mechanically connect electrically conductive pads 10 to associated electrically conductive pads 12. Note that any combination and any configuration of interconnect structures 5b, 5c, and 29 may be used to electrically and mechanically connect electrically conductive pads 10 to associated electrically conductive pads 12. For example, electrical structure 2e may comprise only interconnect structures 5c and 29 to electrically and mechanically connect electrically conductive pads 10 to associated electrically conductive pads 12. There may be any number or ratio of interconnect structures 5b, 5c, and 29 arranged in any pattern (e.g., interconnect structures 5b and 29: may be placed such that they are in alternating positions, may be placed in random positions, may be placed such that there is one interconnect structure 5b for every three interconnect structures 29, may be placed such that interconnect structures 5b provide power and ground connections only and interconnect structures 29 are placed for signal interconnects only, etc). Additionally, electrical structure 2e may comprise an underfill encapsulant layer 31 between substrate 1 and substrate 4.

Figure 6:
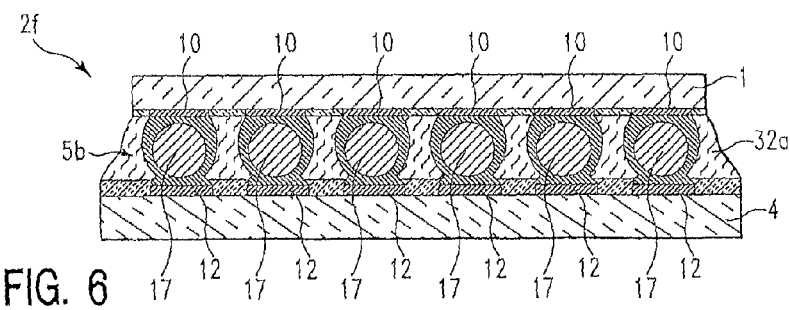
FIG. 6 depicts a second alternative to FIG. 2 illustrating a cross sectional view of a sixth electrical structure, in accordance with embodiments of the present invention.

FIG. 6 depicts a second alternative to FIG. 2 illustrating a cross sectional view of an electrical structure 2f, in accordance with embodiments of the present invention. In contrast with electrical structure 2b of FIG. 2, electrical structure 2f of FIG. 6 comprises an underfill encapsulant layer 32a between substrate 1 and substrate 4. In the case in which substrate 1 is a semiconductor device or a silicon wafer, underfill encapsulant layer 32a may alternately comprise an underfill layer applied prior to chip joining or applied on the silicon wafer over the interconnect structures 5b. Such an underfill layer is defined as a wafer-level underfill.

Figure 7:
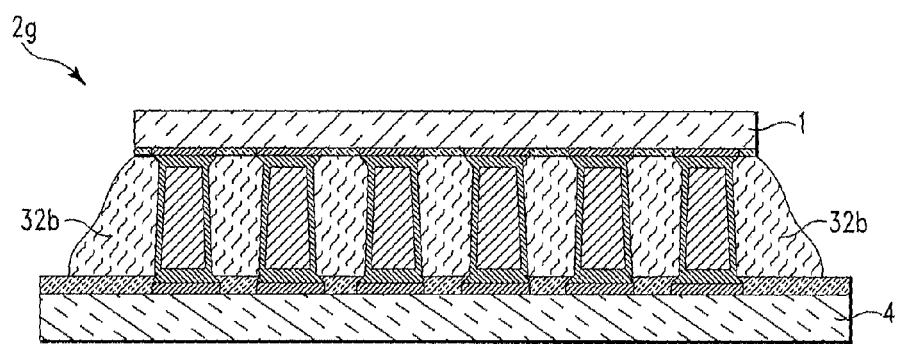
FIG. 7 depicts a second alternative to FIG. 1 illustrating a cross sectional view of an seventh electrical structure, in accordance with embodiments of the present invention.
Figure 8:
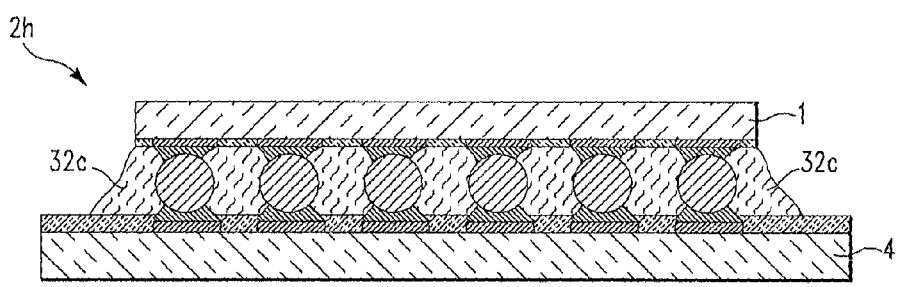
FIG. 8 depicts a second alternative to FIG. 3 illustrating a cross sectional view of a eighth electrical structure, in accordance with embodiments of the present invention.

FIG. 7 depicts a second alternative to FIG. 1 illustrating a cross sectional view of an electrical structure 2g, in accordance with embodiments of the present invention. In contrast with electrical structure 2a of FIG. 1, electrical structure 2g of FIG. 7 comprises an underfill encapsulant layer 32b between substrate 1 and substrate 4. In the case in which substrate 1 is a semiconductor device or a silicon wafer, underfill encapsulant layer 32b may alternately comprise an underfill layer applied prior to chip joining or applied on the silicon wafer over the interconnect structures 5a. Such an underfill layer is defined as a wafer-level underfill FIG. 8 depicts a second alternative to FIG. 3 illustrating a cross sectional view of an electrical structure 2h, in accordance with embodiments of the present invention. In contrast with electrical structure 2c of FIG. 3, electrical structure 2h of FIG. 8 comprises an underfill encapsulant layer 32c between substrate 1 and substrate 4. In the case in which substrate 1 is a semiconductor device or a silicon wafer, underfill encapsulant layer 32c may alternately comprise an underfill layer applied prior to chip joining or applied on the silicon wafer over the interconnect structures 5c. Such an underfill layer is defined as a wafer-level underfill.

FIGS. 9A-9G illustrate a process for generating electrical structure 2a of FIG. 1, in accordance with embodiments of the present invention.

Figure 9A:
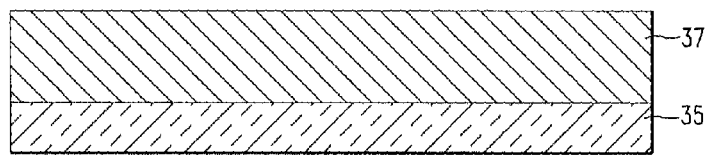
FIGS. 9A-9G illustrate a process for generating the electrical structure of FIG. 1, in accordance with embodiments of the present invention.

FIG. 9A illustrates a cross sectional view of a non-solder metallic layer 37 formed over an insulator layer 35, in accordance with embodiments of the present invention. Non-solder metallic layer 37 may comprise any non-solder metallic material such as, inter alia, copper, gold, nickel, etc. Insulator layer 35 may comprise any insulator material such as, inter alia, a polymer film (e.g., polyimide), etc.

Figure 9B:
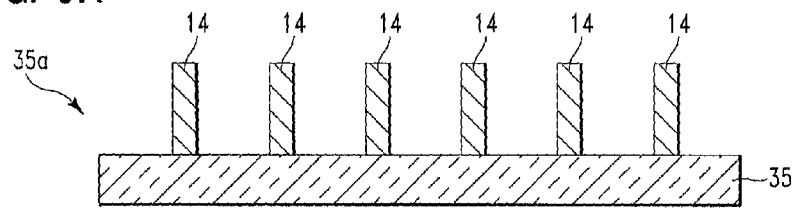

FIG. 9B illustrates a cross sectional view of the structure of FIG. 9A after non-solder metallic interconnect structures 14 have been formed in order to form structure 35a, in accordance with embodiments of the present invention. Non-solder metallic interconnect structures 14 may be formed by subtractively etching portions of non-solder metallic layer 37 (i.e., of FIG. 1) in order to form non-solder metallic interconnect structures 14. Non-solder metallic interconnect structures 14 may comprise various widths, heights, and height-to-width aspect ratios. A subtractive etching process comprises:
1. Applying and patterning a protective photo resist layer
2. Using chemical solutions to etch or dissolve unprotected regions of copper.
3. Stripping off the protective photo resist layer.

Each of non-solder metallic interconnect structures 14 may comprise a width of about 10 microns to about 100 microns and comprise a height-to-width aspect ratio of about 1:1 to about 5:1.

Figure 9C:
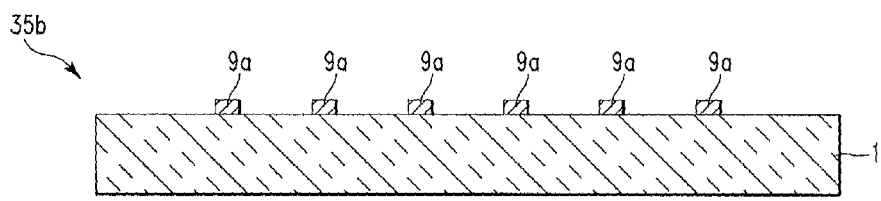

FIG. 9C illustrates a cross sectional view of substrate 1 of FIG. 1 after first portions of solder 9a (i.e., solder structures) have been formed thereby forming a structure 35b, in accordance with embodiments of the present invention. For example, substrate 1 may comprise a silicon device wafer that is prepared with electrically conductive interconnect pads (e.g., see pads 10 of FIG. 1). Solder is applied to the pads in order to form first portions of solder 9a. Any method may be used to apply the solder to the electrically conductive interconnect pads, including, inter alia, applying solder as an injection molded solder.

Figure 9D:
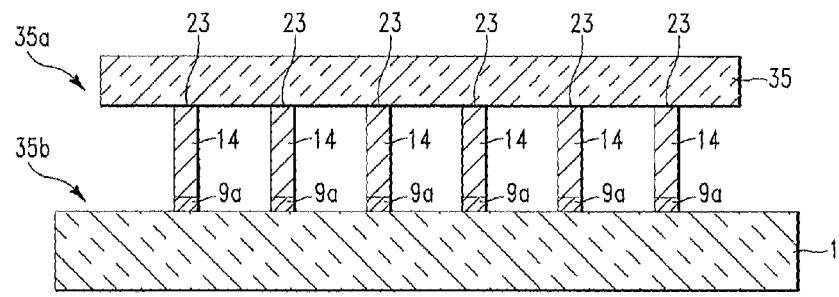

FIG. 9D illustrates a cross sectional view of structure 35a of FIG. 9B of FIG. 1 aligned with structure 35b of FIG. 9C, in accordance with embodiments of the present invention. Non-solder metallic interconnect structures 14 are aligned to associated first portions of solder 9a. The alignment process may comprise using commercially available bonding tools that use optical sensing of fiducials on substrate 1 and insulator layer 35.

Figure 9E:
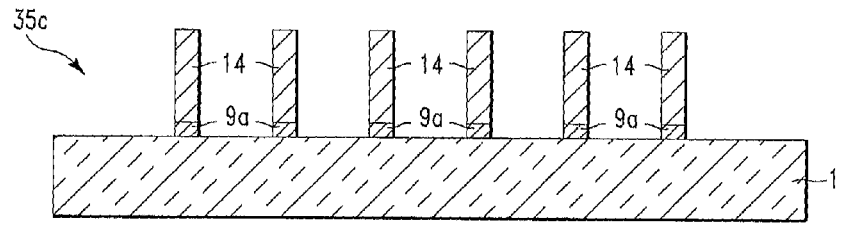

FIG. 9E illustrates a cross sectional view of structure 35c formed after the alignment process described with respect to FIG. 9D, in accordance with embodiments of the present invention. In FIG. 9E, a transfer process has been performed by heating the aligned assembly of FIG. 9D to a temperature above a melting point (i.e., with assistance of a fluxing agent or a fluxing atmosphere) of the solder used to form first portions of solder 9a. Optionally, the transfer process may be assisted by a laser release process applied through a backside 21 of insulator layer 35. Light energy generated by a laser is absorbed by insulator layer 35 at an interface 23 to non-solder metallic interconnect structures 14 causes adhesion (i.e., at interface 23) to be degraded hereby releasing non-solder metallic interconnect structures 14 from insulator layer 35.

Alternatively, an adhesive (i.e., at interface 23) may be degraded and release non-solder metallic interconnect structures 14 from insulator layer 35 during the solder melting process described, supra.

Figure 9F:
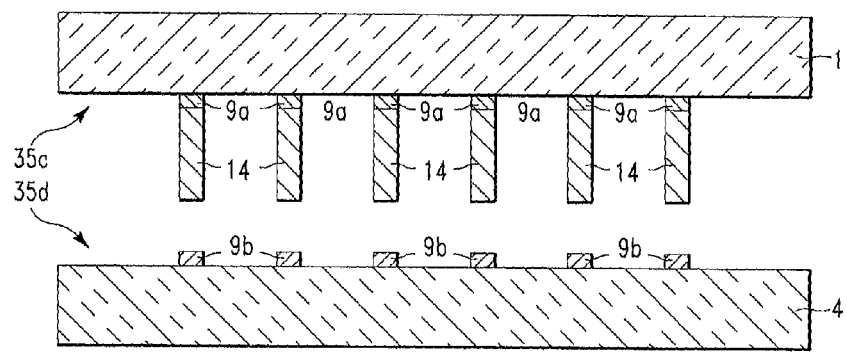

FIG. 9F illustrates a cross sectional view of a process for aligning structure 35c of FIG. 9E with a structure 35d, in accordance with embodiments of the present invention. Structure 35d comprises a substrate 4 comprising formed solder structures 9b (i.e., formed by a similar process to the process performed with respect to FIG. 9C).

Figure 9G:
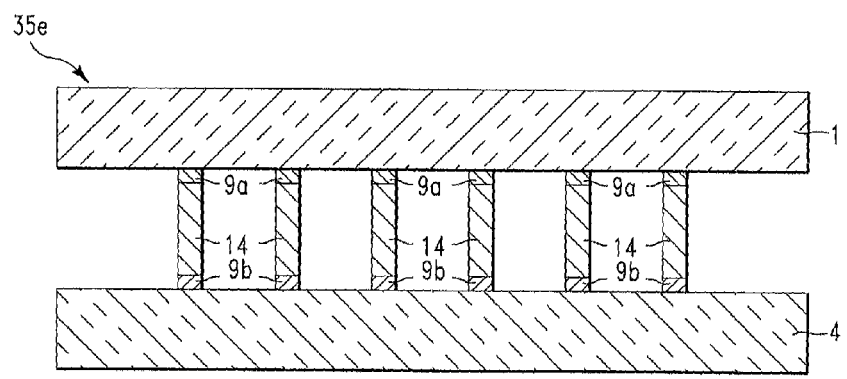

FIGS. 9G illustrates a completed electrical structure 35e similar to electrical structure 2a of FIG. 1, in accordance with embodiments of the present invention. An assembly of substrate 1 to substrate 4 through non-solder metallic interconnect structures 14, solder structures 9a, and solder structures 9b is carried out by raising a temperature of non-solder metallic interconnect structures 14 above a melting temperature of solder structures 9b with the assistance of a fluxing agent or fluxing atmosphere. Optionally, non-solder metallic interconnect structures 14, solder structures 9a, and solder structures 9b may be encapsulated with polymeric material by capillary underfill following the joining of substrate 1 to substrate 4. Alternatively, an underfill encapsulant may be applied at wafer-level or on singulated devices prior to the joining of substrate 1 to substrate 4.

FIGS. 10A-10I illustrate a process for generating electrical structure 2b of FIG. 2, electrical structure 2c of FIG. 3, and electrical structure 2e of FIG. 5, in accordance with embodiments of the present invention. Note that although FIGS. 10A-10I illustrate a process for applying solder as an injection molded solder, any solder applying process may be used.

Figure 10A:
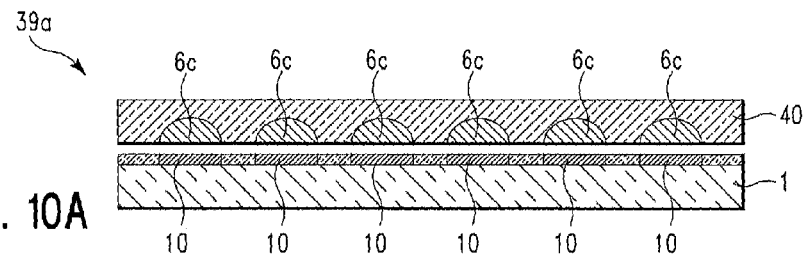
FIGS. 10A-10I illustrate a process for generating the electrical structures of FIG. 2, FIG. 3, and FIG. 5, in accordance with embodiments of the present invention.

FIG. 10A illustrates a cross sectional view of a structure 39a comprising a filled glass or silicon mold 40 positioned over substrate 1 (i.e., from FIGS. 2 and 3), in accordance with embodiments of the present invention. Glass or silicon mold 40 is filled with solder that when released from glass mold will become solder structures 6b of FIG. 2, 6c of FIGS. 3, and 6b of FIG. 5. The solder may comprise any solder suitable for flip chip interconnects including, inter alia, an alloy of tin such as, inter alia, AuSn, SnCu, SnAgCu, etc. The solder may comprise a high melting point so that solder structures 6b, 6c will not melt during a subsequent step.

Figure 10B:
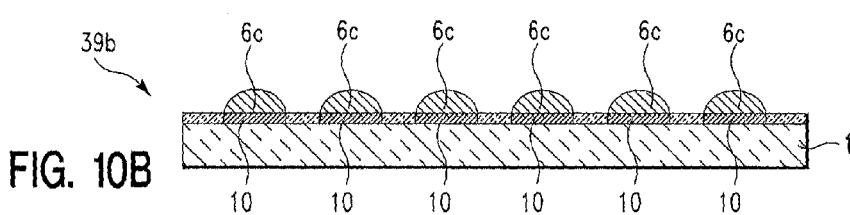

FIG. 10B illustrates a cross sectional view of a structure of 39b formed from structure 39a of FIG. 10A, in accordance with embodiments of the present invention. In FIG. 10B, the solder has been released from glass or silicon mold 40 to form solder structures 6c attached to electrically conductive pads 10 on substrate 1.

Figure 10C:
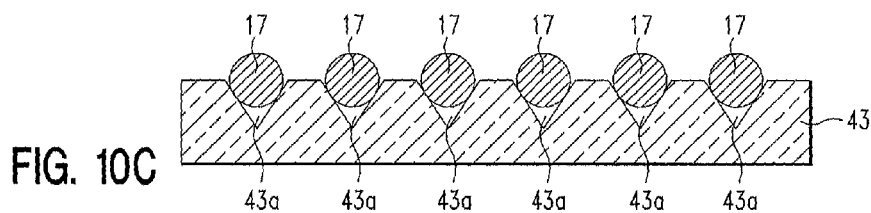

FIG. 10C illustrates a cross sectional view of a transfer substrate 43 comprising a plurality of non-solder metallic core structures 17, in accordance with embodiments of the present invention. Non-solder metallic core structures 17 are positioned in cavities 43a within transfer substrate 43. Each of cavities 43a comprises similar dimensions as non-solder metallic core structures 17 with cavity positions corresponding to positions of associated solder structures 6c on electrically conductive pads 10. Transfer substrate 43 may comprise, inter alia, glass, silicon, or any material used for injection molded solder molds, etc. Non-solder metallic core structures 17 may be dispensed into cavities 43a as a slurry in a solvent such as, inter alia, water isopropanol, etc. The solvent may comprise an appropriate amount of flux to assist in the wetting of solder structures 6c to non-solder metallic core structures 17. In a case in which non-solder metallic core structures 17 are coated with gold, flux is not necessary. Optionally, the solvent may additionally comprise a small amount of thermally degradable polymeric adhesive to aid in retaining non-solder metallic core structures 17 in cavities 43a. Cavities 43a are fabricated to a size that will only cause one non-solder metallic core structure 17 to fall into it during a dispensing of non-solder metallic core structures 17.

Figure 10D:
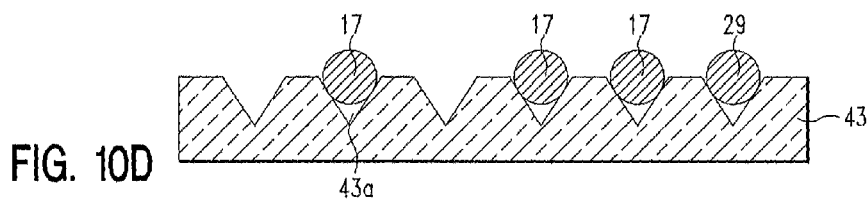

FIG. 10D illustrates a cross sectional view of transfer substrate 43 of FIG. 10C comprising a selected plurality of non-solder metallic core structures 17, in accordance with embodiments of the present invention. As an optional feature of the process, transfer substrate 43 may be covered with a polymeric film (i.e., not shown) with through-holes matching some pre-determined fraction of cavities 43a. The pre-determined fraction of cavities 43a covered by the polymeric film will be prevented from receiving non-solder metallic core structures 17. The pre-determined fraction of cavities 43a allows a packaging design engineer to selectively place non-solder metallic core structures 17. Additionally, solder interconnects 29 may be selectively placed in some of cavities 43a (i.e., instead of select non-solder metallic core structures 17) for placement on substrate 1. In this option, transfer substrate 43 may be couvered with a second polymeric film (i.e., not shown) with through-holes matching the remaining cavities 43a. The cavities 43a covered by the polymeric film will be prevented from receiving solder interconnects 29.

Figure 10E:
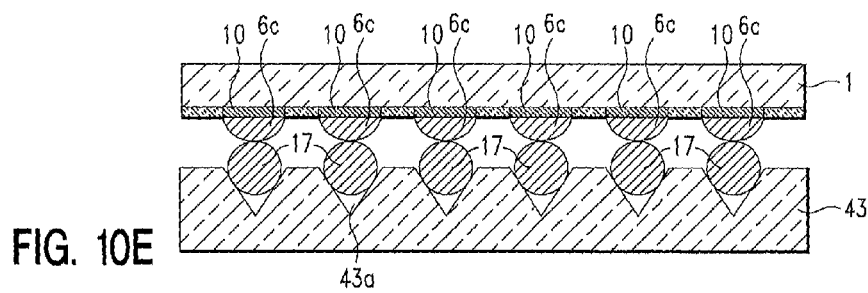

FIG. 10E illustrates a cross sectional view of substrate 1 of FIG. 10B positioned over transfer substrate 43 comprising non-solder metallic core structures 17, in accordance with embodiments of the present invention. Substrate 1 of FIG. 10B is positioned over transfer substrate 43 comprising non-solder metallic core structures 17 in order to transfer non-solder metallic core structures 17 to substrate 1.

Figure 10F:
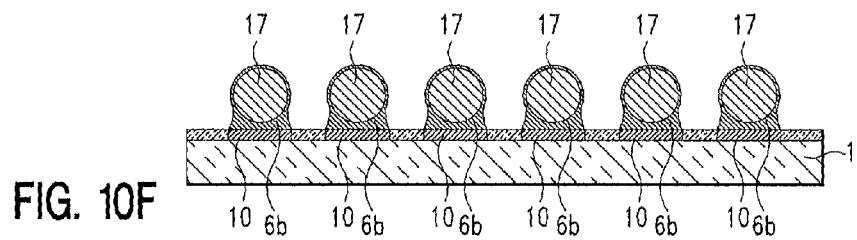

FIG. 10F illustrates a cross sectional view of substrate 1 after non-solder metallic core structures 17 have been released from transfer substrate 43 and connected to solder structures 6b, in accordance with embodiments of the present invention. In FIG. 10F, solder structures 6b completely surround non-solder metallic core structures 17.

Figure 10G:
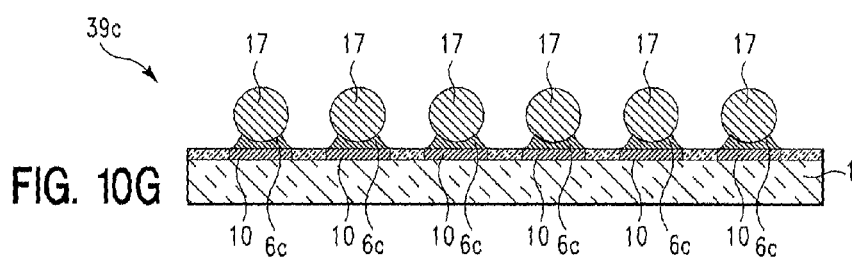

FIG. 10G depicts an alternative to FIG. 10F illustrating a cross sectional view of a structure 39c comprising substrate 1 after non-solder metallic core structures 17 have been released from transfer substrate 43 and connected to solder structures 6c, in accordance with embodiments of the present invention. In FIG. 10G, solder structures 6c partially surround non-solder metallic core structures 17.

Figure 10H:
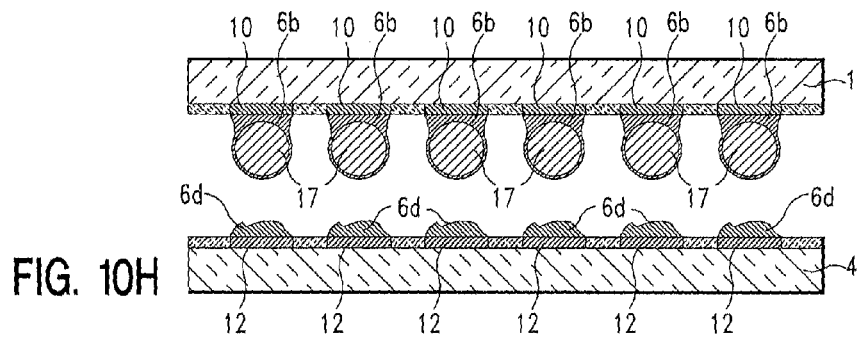

FIG. 10H illustrates a cross sectional view of substrate 1 positioned over substrate 4, in accordance with embodiments of the present invention. Substrate 1 is connected to substrate 4 in order to form electrical structure 2b of FIG. 2.

Figure 10I:
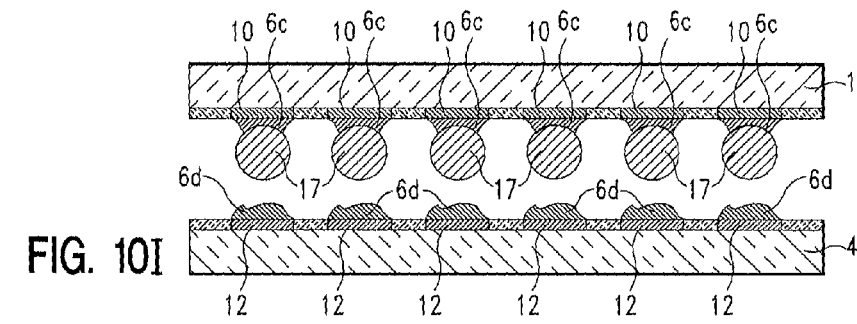

FIG. 10I illustrates an alternative cross sectional view of substrate 1 positioned over substrate 4, in accordance with embodiments of the present invention. In the case in which the option of FIG. 10D is used (i.e., comprising solder interconnect structures 29), the positioning (not shown) is done similarly as in FIG. 10I. Substrate 1 is connected to substrate 4 in order to form electrical structure 2c of FIG. 3.

FIGS. 11A-11F illustrate a process for generating electrical structure 2d of FIG. 4, in accordance with embodiments of the present invention.

Figure 11A:
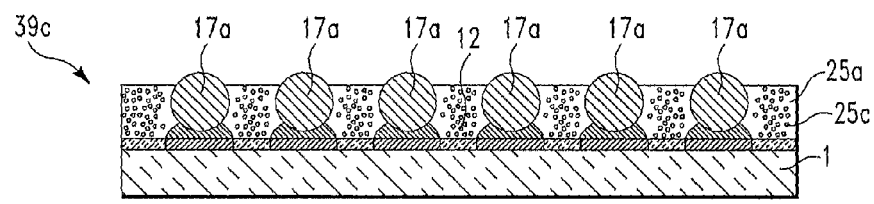
FIGS. 11A-11F illustrate a process for generating the electrical structure of FIG. 4, in accordance with embodiments of the present invention.

FIG. 11A illustrates structure 39c of FIG. 10G comprising an underfill layer 25a, in accordance with embodiments of the present invention. Structure 39c in FIG. 11A has been formed by the process steps described with reference to FIGS. 10A-10E. Underfill layer 25a may comprise a filler 25c to create a low coefficient of thermal expansion (CTE). Underfill layer 25a may comprise a coefficient of thermal expansion (CTE) similar to that of substrate 1.

Figure 11B:
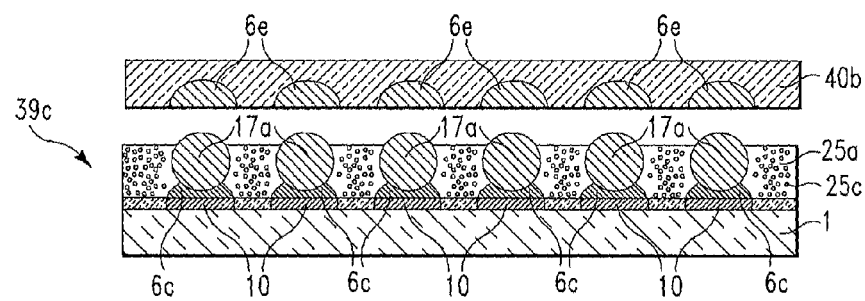

FIG. 11B illustrates structure 39c comprising a glass or silicon mold 40b positioned over non-solder metallic core structures 17a, in accordance with embodiments of the present invention. Glass or silicon mold 40b is filled with solder that when released from mold 40b will become solder structures 6e of FIG. 4. The solder may comprise any solder suitable for flip chip interconnects including, inter alia, an alloy of tin such as, inter alia, AuSn, SnCu, SnAgCu, etc. The solder may comprise a high melting point so that solder structures 6e will not melt during a subsequent step.

Figure 11C:
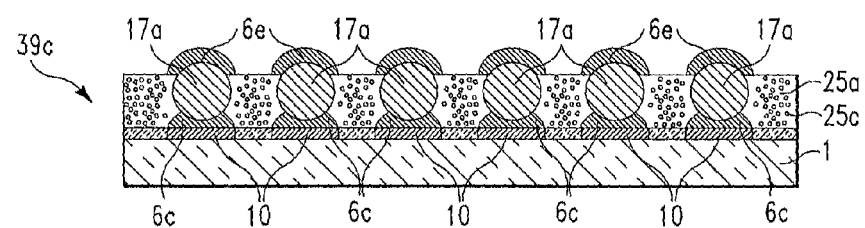

FIG. 11C illustrates a cross sectional view of structure of 39c comprising solder structures 6e attached to non-solder metallic core structures 17a, in accordance with embodiments of the present invention. In FIG. 11C, the solder has been released from glass or silicon mold 40b to form solder structures 6e attached to non-solder metallic core structures 17a.

Figure 11D:
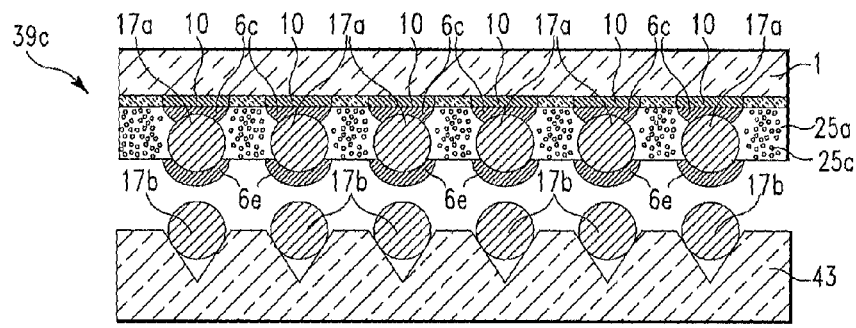

FIG. 11D illustrates a cross sectional view of structure 39c of FIG. 11C positioned over a transfer substrate 43 comprising non-solder metallic core structures 17b, in accordance with embodiments of the present invention. Structure 39c of FIG. 11C is positioned over transfer substrate 43 comprising non-solder metallic core structures 17b in order to transfer and connect non-solder metallic core structures 17b to non-solder metallic core structures 17a.

Figure 11E:
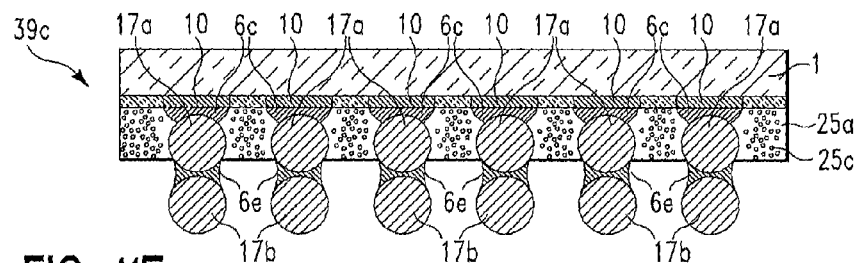

FIG. 11E illustrates a cross sectional view of structure 39c of FIG. 11D after non-solder metallic core structures 17b have been connected to non-solder metallic core structures 17a, in accordance with embodiments of the present invention.

Figure 11F:
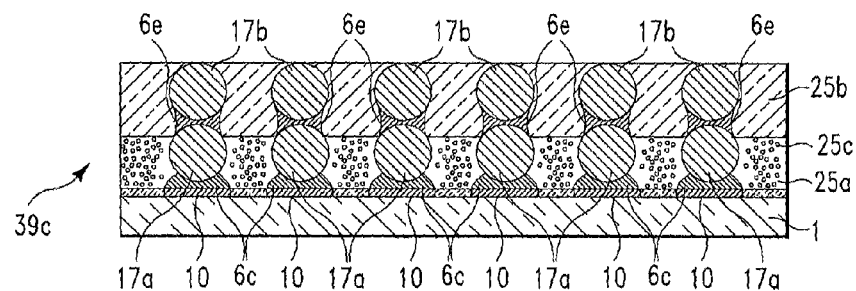

FIG. 11F illustrates a cross sectional view of structure 39c of FIG. 11E comprising an underfill layer 25b applied over underfill layer 25a, in accordance with embodiments of the present invention. After underfill layer 25b is applied over underfill layer 25a, substrate 1 is connected to substrate 4 in order to form electrical structure 2d of FIG. 4.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for forming an electrical structure comprising:
providing a first substrate comprising a first electrically conductive pad, a second substrate comprising a second electrically conductive pad, and a transfer film comprising a non-solder metallic core structure, wherein said non-solder metallic core structure comprises a cylindrical shape;
forming a first solder structure on said first electrically conductive pad;
first positioning after said forming said first solder structure, said transfer film such that a first side of said non-solder metallic core structure is in contact with said first solder structure;
first heating after said first positioning, said non-solder metallic core structure to a temperature sufficient to cause said first solder structure to melt and form an electrical and mechanical connection between said first side of said non-solder metallic core structure and said first electrically conductive pad;
removing after said first heating, said transfer film from said non-solder metallic core structure;
forming a second solder structure on said second electrically conductive pad;
second positioning, after said forming said second solder structure, said first substrate comprising said non-solder metallic core structure such that a second side of said non-solder metallic core structure is in contact said second solder structure; and
second heating after said second positioning, said non-solder metallic core structure to a temperature sufficient to cause said second solder structure solder to melt and form an electrical and mechanical connection between said second side of said non-solder metallic core structure and said second electrically conductive pad resulting in an electrical and mechanical connection between said first electrically conductive pad and said second electrically conductive pad.

2. The method of claim 1, wherein said forming said first solder structure comprises applying a first portion of molten solder to said first electrically conductive pad from a transfer substrate comprising a first cavity filled with said first portion of molten solder, and wherein said forming said second solder structure comprises applying a second portion of molten solder to said second electrically conductive pad from said transfer substrate comprising a second cavity filled with said second portion of molten solder.

3. The method of claim 1, wherein said removing said transfer film from said non-solder metallic core structure comprises laser ablating the transfer film, resulting in releasing said non-solder metallic core structure from said transfer film.

4. The method of claim 1, wherein said transfer film is bonded to said non-solder metallic core structure with a thermally degradable adhesive.

5. The method of claim 1, further comprising:
after said removing said transfer film from said non-solder metallic core structure, applying a wafer level underfill encapsulant layer to said first substrate.

6. The method of claim 1, wherein a first section of a surface of said non-solder metallic core structure and a second section of said surface of said non-solder metallic core structure in combination form an entire exterior surface of said non-solder metallic core structure, and wherein said first solder structure and said second solder structure in combination surround and are in electrical and mechanical contact with an entire exterior surface of said non-solder metallic core structure.

7. The method of claim 1, wherein said non-solder metallic core structure comprises copper.

8. The method of claim 1, wherein said non-solder metallic core structure comprises gold.

9. The method of claim 1, wherein said non-solder metallic core structure comprises nickel.

10. The method of claim 1, wherein said first substrate comprises a substrate selected from the group consisting of a semiconductor device, a chip carrier, and a printed circuit board.

11. The method of claim 1, wherein said second substrate comprises a substrate selected from the group consisting of a semiconductor device, a chip carrier, and a printed circuit board.

12. The method of claim 1, wherein said first substrate comprises a third electrically conductive pad, wherein said second substrate comprises a fourth electrically conductive pad, wherein said transfer film comprises an additional non-solder metallic core structure, and wherein said additional non-solder metallic core structure comprises a cylindrical shape;
forming a third solder structure on said third electrically conductive pad, wherein said first positioning comprises positioning said transfer film such that a first side of said additional non-solder metallic core structure is in contact with said third solder structure;

third heating, said additional non-solder metallic core structure to a temperature sufficient to cause said third solder structure to melt and form an electrical and mechanical connection between said first side of said additional non-solder metallic core structure and said third electrically conductive pad;

removing, said transfer film from said additional non-solder metallic core structure;

forming a fourth solder structure on said fourth electrically conductive pad, wherein said second positioning comprises positioning said first substrate comprising said additional non-solder metallic core structure such that a second side of said additional non-solder metallic core structure is in contact said fourth solder structure; and fourth heating, said additional non-solder metallic core structure to a temperature sufficient to cause said fourth solder structure solder to melt and form an electrical and mechanical connection between said second side of said additional non-solder metallic core structure and said fourth electrically conductive pad resulting in an electrical and mechanical connection between said third electrically conductive pad and said fourth electrically conductive pad.

13. The method of claim 12, wherein said non-solder metallic core structure comprises a first width, and wherein said additional non-solder metallic core structure comprises a second width differing from said first width.

14. The method of claim 12, wherein said non-solder metallic core structure comprises a first length, and wherein said additional non-solder metallic core structure comprises a second length differing from said first length.

15. The method of claim 12, wherein said non-solder metallic core structure comprises a first height-to-width aspect ratio, and wherein said additional non-solder metallic core structure comprises a second height-to-width aspect ratio differing from said first height-to-width aspect ratio.

16. The method of claim 1, wherein said first substrate comprises a third electrically conductive pad, wherein said second substrate comprises a fourth electrically conductive pad, wherein said transfer film comprises an additional solder structure, wherein said additional solder structure comprises a cylindrical shape, and wherein said first positioning comprises positioning said transfer film such that a first side of said additional solder structure is in contact with said third electrically conductive pad;

third heating, said additional solder structure to a temperature sufficient to cause said additional solder structure to melt and form an electrical and mechanical connection between said first side of said additional solder structure and said third electrically conductive pad;

removing, said transfer film from said additional solder structure, wherein said second positioning comprises positioning said first substrate comprising said additional solder structure such that a second side of said additional solder structure is in contact said fourth electrically conductive pad; and fourth heating, said additional solder structure to a temperature sufficient to cause said additional solder structure solder to melt and form an electrical and mechanical connection between said second side of said additional solder structure and said fourth electrically conductive pad resulting in an electrical and mechanical connection between said third electrically conductive pad and said fourth electrically conductive pad.

17. The method of claim 16, wherein said non-solder metallic core structure comprises a first length, and wherein said additional solder structure comprises a second length differing from said first length.

18. The method of claim 16, wherein said non-solder metallic core structure comprises a first height-to-width aspect ratio, and wherein said additional solder structure comprises a second height-to-width aspect ratio differing from said first height-to-width aspect ratio.

19. The method of claim 16, wherein said non-solder metallic core structure comprises a first width, and wherein said additional solder structure comprises a second width differing from said first width.

20. The method of claim 1, wherein said non-solder metallic core structure comprises copper and gold.

* * * * *